(12) United States Patent
Lo et al.

(10) Patent No.: US 7,852,117 B1
(45) Date of Patent: Dec. 14, 2010

(54) HIERARCHICAL INTERFACE FOR IC SYSTEM

(75) Inventors: Jack S. Lo, Santa Clara, CA (US); Christopher E. Neely, San Jose, CA (US); Gordon J. Brebner, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/505,239

(22) Filed: Jul. 17, 2009

(51) Int. Cl.
*H03K 19/0175* (2006.01)
(52) U.S. Cl. ............................. 326/62; 326/63; 326/41; 326/47
(58) Field of Classification Search ........................ None
See application file for complete search history.

(56) References Cited

U.S. PATENT DOCUMENTS 6,809,551 B1 * 10/2004 Wicker, Jr. .................... 326/41
7,573,295 B1 * 8/2009 Stadler ......................... 326/40

OTHER PUBLICATIONS

U.S. Appl. No. 12/505,243, filed Jul. 17, 2009, Neely et al.
Bergamaschi, R.A. et al., "Automating the Design of SOCs Using Cores," *IEEE Design & Test of Computers*, Sep.-Oct. 2001, pp. 32-45, vol. 18.
Chen, M.K. et al., "Shangi-La: Achieving High Performance from Compiled Network Applications while Enabling Ease of Programming," *Proc. of the 2005 ACM SIGPLAN Conference on Programming Language Design and Implementation*, Jun. 11-15, 2005, pp. 224-236, New York, New York, USA.
International Telecommunication Union *OAM functions and mechanisms for Ethernet based networks*, May 2006, pp. 1-80, ITU-T Y.1731, available from the International Telecommunication Union, Geneva, Switzerland.
Janneck, Jorn, *Notes on an actor language*, Feb. 13, 2007, pp. 1-27, presented at the 7$^{th}$ Biennial Ptolemy Miniconference, University of California at Berkeley, Berkeley, California, USA.
Keller, Eric et al., *Software Decelerators*, Sep. 2, 2003, pp. 1-18, presented at the 13$^{th}$ Annual Conference on Field Programmable Logic and Applications, Lisbon, Portugal.
Keller, Eric et al., "Software Decelerators," *Proc of the 13$^{th}$ International Conference on Field Programmable Logic and Applications*, Apr. 20-23, 2004, pp. 385-395, Napa, California, USA.
Kulkarni, Chidamber et al., "Mapping a Domain Specific Language to a Platform FPGA," *Proc. of the 2004 Design Automation Conference*, Jun. 7-11, 2004, San Diego, California, USA.

(Continued)

*Primary Examiner*—Anh Q Tran
(74) *Attorney, Agent, or Firm*—Scott Hewett; Lois D. Cartier

(57) ABSTRACT

An integrated circuit includes an auto-bridging architecture including a first phases block that interfaces to a first user block having a first user signal domain. The first phases block converts the first user signal domain to a common signal domain. A second phases block coupled to the first phases block interfaces with a second user block having a second user signal domain. The second phases block converts the second user signal domain to the common signal domain so that the first user block cooperates with the second user block through the auto-bridging architecture of the IC.

11 Claims, 4 Drawing Sheets

OTHER PUBLICATIONS

Lockwood, John W., "Automated Tools to Implement and Test Internet Systems in Reconfigurable Hardware," *ACM SIGCOMM Computer Communications Review*, Jul. 2003, pp. 103-110, vol. 33, Issue 3.

Morris, Robert et al., "The Click modular router," *ACM SIGOPS Operating Systems Review*, Dec. 1999, pp. 217-231, vol. 33, No. 5.

Shah, Niraj et al., "NP-Click: A Productive Software Development Approach for Network Processors," *IEEE Micro*, Sep.-Oct. 2004, pp. 45-54, vol. 24, No. 5.

* cited by examiner

HIERARCHICAL INTERFACE FOR IC SYSTEM

FIELD OF THE INVENTION

The present invention relates generally to integrated circuits ("ICs"), and more particularly to connecting functional blocks in an IC system.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

The programming used to configure an FPGA or other PLD is often very complex. It is common to use a modeling system to simulate the operation of the programming to evaluate how a physical FPGA will operate when used in a system, such as a system on a chip ("SoC"). In some systems, a PLD interfaces with or includes functional blocks. For example, an FPGA includes an embedded processor operating at a first clock speed, and an I/O interfacing peripheral and a customized computation peripheral (such as a digital processing or image processing filter) operating at a different clock speed. Multiple simulators are integrated into the modeling system to simulate the different functional blocks. In yet other instances, the PLD devices themselves are used in the simulation as emulators. In this case, a portion of a design physically runs on a PLD device while the rest of the design is simulated by the simulators running on a host PC. A modeling system interface controls the simulation progress of the software simulators or emulation hardware, and exchanges simulation data between them when needed.

System level design requires the ability to quickly connect and adapt compatible blocks together. Previously, this required that block interfaces either match by design or be explicitly designed to match a known standard by the development team(s). The former approach restricts the set of usable blocks to only those provided by a system level design tool, while the latter approach requires cumbersome re-design work when legacy designs are upgraded or changed.

Capturing the behavior and properties of block interfaces in IC systems has been studied in depth for quite some time. Previous work has focused on capturing interface timing and behavior through a variety of methods including waveforms or automata descriptions (e.g., state machines). Using automata to define interface behavior between blocks is widely used because almost any sequence of signal assertions can be described. Numerous algorithms have been devised to resolve differences in interface automata leading to the synthesis of a bridging component between two disparate interfaces. However, the limitations of these approaches lie in the inability to capture and resolve all aspects of interface differences, particularly in pipelined operations, data width mismatches, or clock domain differences. In addition, a thorough state machine description, though general, is often too cumbersome to use in describing an interface of a user block. The time and effort required to write an interface automata for a user block may not be that far off from designing a bridging element directly, thus offering no benefit for quick system-level prototyping.

Techniques for comparing and resolving inter-block connections in an IC system that avoid the disadvantages of the prior art are desirable.

SUMMARY

An integrated circuit includes an auto-bridging architecture including a first phases block that interfaces to a first user block having a first user signal domain. The first phases block converts the first user signal domain to a common signal domain. A second phases block coupled to the first phases block interfaces with a second user block having a second user signal domain. The second phases block converts the second user signal domain to the common signal domain so that the first user block cooperates with the second user block through the auto-bridging architecture of the IC.

DETAILED DESCRIPTION

Embodiments provide a uniform yet flexible architecture for bridge components (i.e., between user blocks in an IC system) that ease interface protocol changes and upgrades. Prior work focused mainly on mapping different interfaces to a common interface specification to achieve compatibility.

However, this approach restricts the kinds of communication architectures that are possible to those supported by the common interface specification. Resolving the signals between different blocks requires intimate knowledge of interface protocols and extensive testing. The designs are developed for a specific block since the goal is to quickly connect two blocks together. Future expansion, upgrades in a block component, or other changes to the IC system are not typically considered. Something as simple as doubling a data bus width can require a significant re-design in the interface shim, which is basically a translation agent between two functional blocks in the IC system. For a new or sufficiently changed block, a designer would have to create a custom shim in order to map to the common interface specification to the new block. Often, the common interface specification limits the allowable nature and types of changes for future designs or upgrades.

In order to overcome the restrictions of designing to a fixed common interface specification or designing a completely custom and shim block, embodiments provide a configurable auto-bridging architectural block that resolves interface differences automatically. Auto-bridging components according to embodiments are particularly desirable in the context of system-level design when intellectual property cores (commonly called "IPs") from different sources (e.g., vendors or users), often designed at different times by different engineering teams, are assembled together in an IC system.

According to a particular embodiment, an auto-bridge is generated and inserted to resolve disparate connections between IPs. Being able to utilize a uniform and flexible architecture as a bridge component facilitates designing block interfaces for IC systems. The uniform nature of auto-bridging interfaces lend themselves to being generated by automated synthesis tools, which further speeds and streamlines IC system design.

I. An Exemplary Auto-Bridging Architecture

Figure 1:
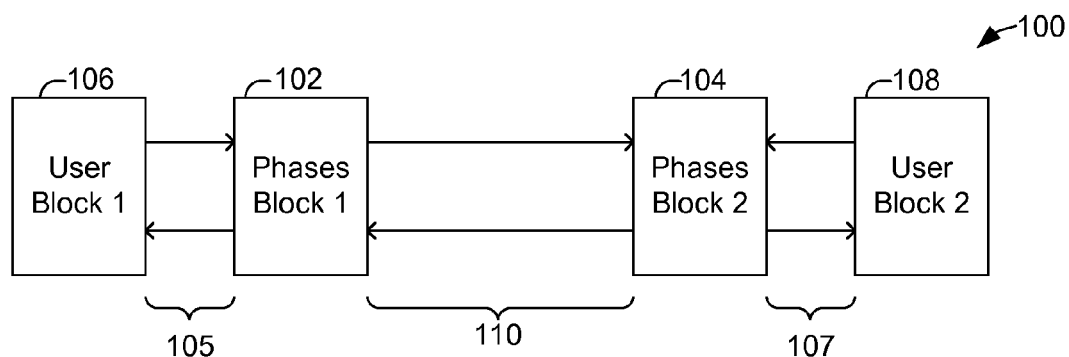
FIG. 1 is a diagram of a portion of a high-level modeling environment with a co-simulation interface according to an embodiment of the invention.

FIG. 1 shows an auto-bridging architecture 100 according to an embodiment. The architecture includes two phases blocks 102, 104, and two user blocks 106, 108. Examples of user blocks can be masters as slaves in an embedded design such as a processor core or a UART core. Another example in a pipelined networking architecture may be a different packet processing blocks in a network pipeline such as an address lookup or packet parser. The auto-bridging architecture 100 is instantiated in an IC simulation system, as computer-executable instructions on a computer-readable device, in an IC incorporating a system-on-a-chip, or in a multi-chip IC system. The term "phases" as used herein are an assertion of groups of signals where the values of each signal in the group do not change over the duration for which the phase is valid. For example, a phase for a memory access interface type can be the "request phase," the "data phase," and the "response phase." Phases blocks 102, 104 are responsible for latching, converting and forwarding groups of signals. It is the interaction and dependencies between phases blocks 102, 104 that control the order of interface signaling.

Figure 2:
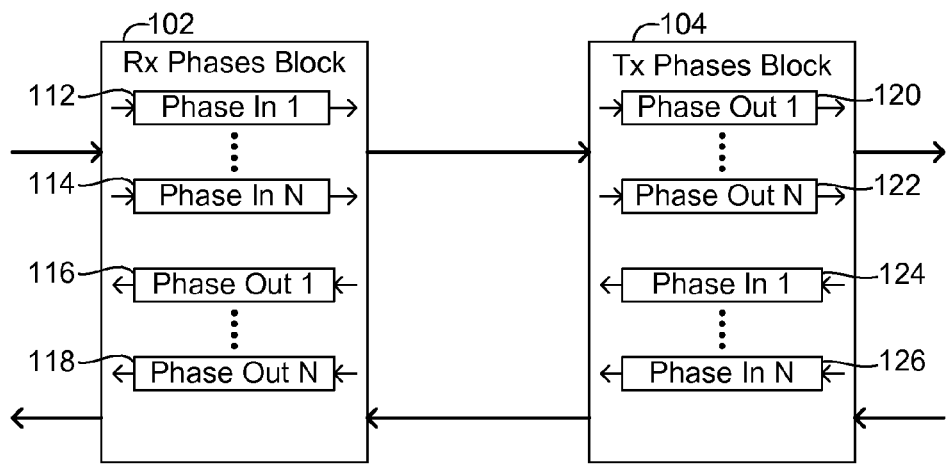
FIG. 2 is an illustration of an embodiment of a co-simulation synchronization interface according to an embodiment of the invention.

The basic auto-bridging architecture includes a receive phases block (RX Phases) and a transmit phases block (TX Phases) as shown in FIG. 2. The RX Phases block connects directly to a first user signal domain (i.e., a first user block interface) 105 of the first (source) user block 106, while the TX Phases block connects to a second user signal domain 107 of the second (sink) user block 108. The terms, "source" and "sink" depend on the function particular blocks are engaged in at a particular point in the operation of the IC system. Those of skill in the art of IC system design understand that a block might act as a source block during one operation, and as a sink block for another operation. Thus, these terms are used in an exemplary, and not in a limiting, fashion.

Each phases block 102, 104 is responsible for interpreting the respective interfaces and protocols for their associated user blocks, and for asserting common core signals based on those user-based interfaces. The common core signals are passed between phases blocks 102, 104 in a common signal domain 110. Examples of core signals include data, address, and command type. Within each phases block 102, 104, multiple phase processing modules can be found each responsible for processing a particular phase of the interface protocol and passing control and data to subsequent phases as necessary. Phases are interpreted for either signal direction in the form of Phase In and Phase Out blocks. Each phases block typically contains multiple Phase In blocks and multiple Phase Out blocks (generally "phase blocks"; see, e.g., FIG. 2), where connections between single phase blocks are used to keep track of the current state of the interface protocol. Block timing dependencies are typically extracted from the system design expressed in RTL code such as VHDL or VERILOG. The VHDL or VERILOG design is synthesized and mapped to a bitstream used to configure the IC system, such as configuring physical resources in an FPGA to a particular application or IP function, and is applied to the design of the block-to-block connections. Phase In blocks generally indicate when events have been detected while Phase Out blocks generally assert signals based on events and phase dependencies.

The phase blocks themselves consist of a code translation function and conversion function which converts between signals and events specific to their associated user blocks into the common signal domain 110. This common signal domain is a common set of signals and signal protocols that all Phase In and Phase Out blocks communicate over. Events are a decoded signal assertion specific to an interface type. "Interface type" means a combination of the kind of interface that exists between user blocks, such as a memory interface type or a packet interface type, and the type of protocol interaction within that interface, such as a read command or a data response. Examples of events include "single read" and "error response." Registers are optionally used to latch data for each phase (see FIG. 3, ref. num. 138). The assertion and release of each phase is handled by control signals (see FIG. 3, ref. nums. 134, 136) that can originate from other phase blocks (e.g., upstream or downstream phase blocks).

FIG. 2 is a diagram of a reception phases block 102 and a transmission phases block 104 according to an embodiment. The reception phases block 102 has a number of Phase In blocks 112, 114, and a number of Phase Out blocks 116, 118. Similarly, the transmission phases block 104 has a number of Phase Out blocks 120, 122 and a number of Phase In blocks 124, 126. The number of phase blocks of each type in a phases block typically depends on the type of user block associated with the phases block. Referring to FIG. 1, for example, User Block 106 may have more or fewer ports, or greater or lesser functionality, than User Block 108; thus, the associated phases blocks might be different. The phases blocks are typically generated according to a description (e.g., an element description language ("EDL") and an interface description language ("IDL")) of the associated user block.

Figure 3:
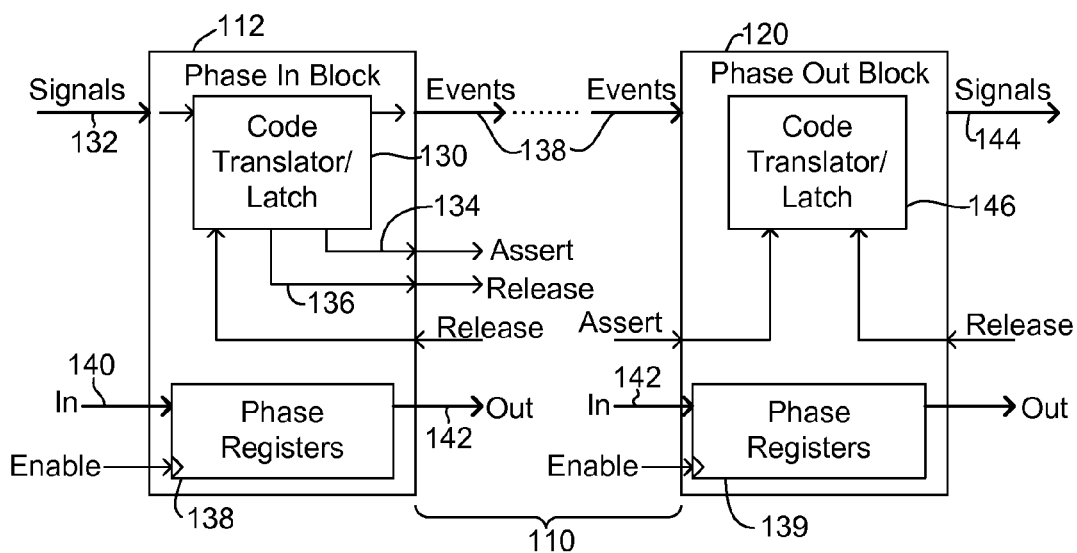
FIG. 3 is a diagram of a high-level modeling environment with two different co-simulators according to another embodiment.

FIG. 3 shows a diagram of a Phase In block 112 and a Phase Out block 120 according to an embodiment. The Phase In block 112 has a code translator/latch 130 that receives signals 132 from a user block (see, FIG. 1, ref. num 106), interprets the timing and coding of the input, and translates them into events in the common signal domain 110 along with downstream control signals 134, 136 that the phase out block (e.g., Phase Out block 120) can understand and translate into output signals having timing and coding that the associated downstream user block (e.g., FIG. 1, User Block 2) understands.

The Phase In block 112 operates by pulsing an output assert signal 134 and release signal 136 to indicate the timing boundaries of the particular phase. The output assert signal 134 indicates when the decoded data (i.e., the event) in the phase block are valid and marks the beginning of that data. The output release signal 136 captures the end of the time when the decoded data is valid (i.e., when the event is complete). In the case of continuous signals (back-to-back events), an input release signal is used to force a new output assert. A phase register 138, which in a further embodiment is a set of phase registers, latches the phase-related signals (data) In 140 when the phase is asserted. These signals do not need to be translated into the common signal domain 110, and can be passed (Out 142) to the phase register 139 in the Phase Out block 120 as-is. The data in the phase registers 138 may, however, need to be reorganized, redirected or duplicated depending on the interface behavior (i.e., FIG. 1, the first user signal domain 105 between the user block 106 and the Phases Block 120).

The Phase Out block 120 receives events and translates them into coded signals 144 for the down-stream user block (see, e.g., FIG. 1, ref. num. 108) using a code translator/latch 146. The timing for when signals 144 are asserted from the Phase Out block 120 and released to the user block is dependent on other phase timings or constant delays. These phase timings are delays are obtained by analyzing the user blocks (106 and 104 of FIG. 1).

Assert and release signals originate from other Phase In or Phase Out blocks or are tied to a constant value. Which Phase In or Phase Out block is used as source for a particular Assert or Release signal of a particular Phase In or Phase Out block is determined through a protocol analysis step, which in an exemplary embodiment occurs during the auto-bridging function. The auto-bridging function analyses the user signal domains (user block interfaces) by analyzing the behavioral level descriptions (described below in section II-A), and determines what the phases are in the Rx and Tx Phases blocks and how the assert and release signals for each Phase In and Phase Out block are connected.

The architecture shown in FIGS. 1-3 is suitable for interface protocols (i.e., between user blocks and phases blocks) operating with the same data width and clock domains. Other embodiments support the cases where user blocks operate with different data widths or clock domains. In those cases, intermediary components are introduced between the RX Phases and TX Phases blocks to resolve the differences. The attributes of these intermediate blocks are extracted from behavioral level descriptions (as described below in reference to the Hierarchical Interface Description) and can be continually updated in future revisions of an IC system design tool, and can bridge connections between user blocks or IP previously believed to be inefficient, if not impossible, to connect using conventional user block-to-user block interfacing techniques.

Figure 4:
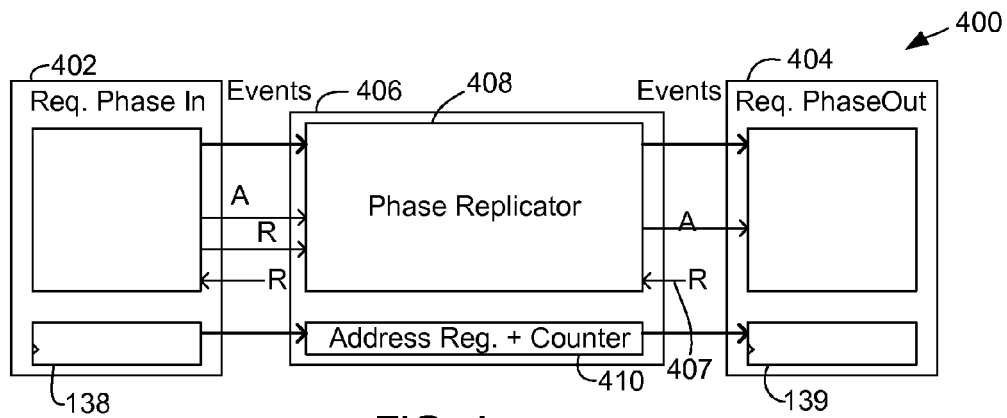
FIG. 4 is a diagram of a high-level modeling environment with an on-chip peripheral bus according to another embodiment.

FIG. 4 is a diagram of an interface 400 between phases blocks 402, 404 including an intermediary component 406 according to an embodiment. Examples of intermediary components include burst support for memory access interfaces, fan-out/fan-in. Burst support can be added with a phase replicator block 408. The intermediary component 406 operates in response to replies 407 to coded signals from the Phase Out request block 404 generated according to burst phase events (first, continuous, last) from 402. Replication of events (data) and timing signals is necessary when translating from single request bursts to multiple request bursts or multiple single request operations, for example. In addition, the memory address(es) can be latched and incremented appropriately (e.g., fixed, streaming, increment, or wrapped) through an address register and counter 410 to control data flow between registers 138, 139.

Intermediary components facilitate automatically bridging dissimilar interfaces to connect user blocks or IP. The intermediary components operate in the common signal domain (see, FIGS. 1, 4, ref. num. 110), which is translatable to user block or IP protocols through the phases blocks. Hence, changes to the user blocks, such as an upgrade or substitution, are handled by the design tool without having to generate unique code for directly bridging user blocks or IP. Basically, each user block protocol is translated to a common protocol (i.e., the common signal domain) by their respective phases blocks. A first phases block translates a first user block interface to a common signal domain, and a second phases block translates a second user block to the common signal domain. Intermediary components are optionally included that are defined (e.g., for input and output) within the common signal domain that can match user blocks, even across disparate time or data domains. Embodiments provide configurable auto-bridging techniques that accelerate system level design and allow system designers to design IC systems at a higher level of extraction.

II. An Exemplary Hierarchical Interface Description

A hierarchical description of interfaces uses a hierarchical model to provide the comprehensiveness of a state machine description while simplifying the details presented to an IC system developer. In a particular embodiment, a hierarchical description compares and resolves connections between blocks (e.g., user blocks or IP) in a system level design tool.

Figure 5A:
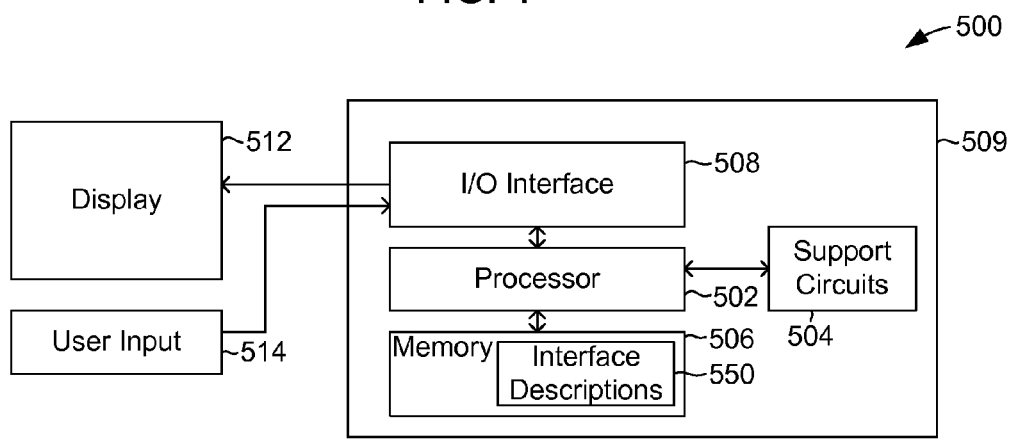
FIG. 5A is a diagram of a system level design tool according to an embodiment.

FIG. 5A is a diagram of a system level design tool 500 according to an embodiment. The design tool 500 includes a central processing unit (CPU) 502, a memory 506, support circuits 504, and an I/O interface 508, typically integrated in a computer 509 or similar machine. The support circuits 504 for the CPU 502 include conventional cache, power supplies, clock circuits, data registers, and I/O interfaces, for example. The I/O interface 508 may be directly coupled to the memory 506 or coupled through the CPU 502, and may be coupled to a conventional keyboard, network, mouse, printer, and interface circuitry adapted to receive and transmit data, such as data files. The I/O interface 508 is coupled to a display 512 or other output device, and a user can input commands and data through an input device 514, such as a keypad, mouse, or stylus. Some embodiments incorporate a touch-screen that operates as both a display and as an input device.

The memory 506 stores one or more programs or data to implement one or more embodiments. Although exemplary embodiments of the invention are disclosed as being implemented as a computer executing a software program, those skilled in the art will appreciate that the invention may be implemented in hardware, software or a combination of hardware and software. Implementations may include a number of processors independently executing various programs and dedicated hardware, such as application specific integrated circuits (ASICs).

The design tool 500 may be programmed with an operating system, such as OS/2, Java Virtual Machine, 10 Linux, Solaris, Unix, Windows, Windows95, Windows98, Windows NT, and Windows2000, WindowsME, or WindowsXP. At least a portion of an operating system is stored in the memory 506, which may include random access memory, read-only memory, magneto-resistive read/write memory, optical read/write memory, cache memory, or magnetic read/write memory. The memory 506 stores all or a portion of one or more hierarchal interface descriptions 550 according to an embodiment, which is described in further detail below in reference to FIG. 5B. Models of other system blocks (see, FIG. 5B, ref. nums. 566, 568) are also typically stored in the memory 506 or in computer-readable devices and used during modeling of the IC system. The individual blocks are omitted from FIG. 5A for purposes of clarity, as they are well-known to those of skill in the art of IC system design.

In comparison to a state machine, the levels of abstraction used in embodiments are designed to improve efficiency and usefulness for interface comparisons. A state machine is generally written at a single level of abstraction (typically being defined at a relatively low (i.e., highly detailed) level) for a general version of the state machine, with even more details being incorporated into the state machine (model) when a specific state machine is mapped onto the general version. In contrast, hierarchal interface models according to embodiments use an element description language ("EDL") or an interface description language ("IDL") to provide an interface environment at a high, more useful, level of abstraction. Embodiments allow a user to easily compare different interfaces and to match system components, such as user blocks or third-party IP cores, to each other.

Figure 5B:
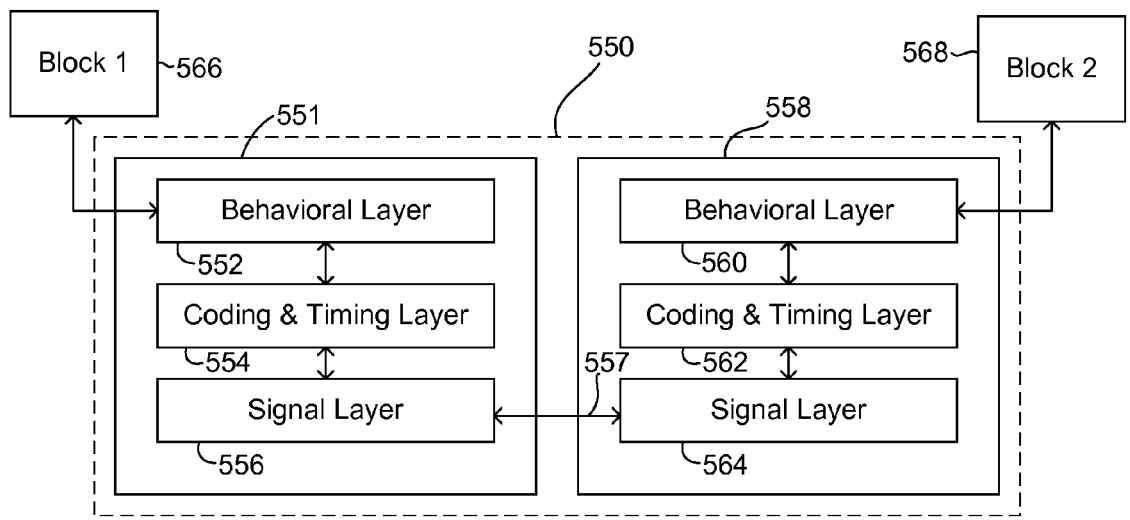
FIG. 5B is a diagram of the hierarchical interface description of FIG. 5A.

FIG. 5B is a diagram of the hierarchical interface descriptions 550 of FIG. 5A. The hierarchical interface description 550 includes models of interfaces 551, 558 between components (models of blocks) 566, 568 of an IC system that are typically run on an IC system design tool or computer (see FIG. 5A). Alternatively, some embodiments include interface descriptions stored on a computer-readable device. The interface model is typically a set of computer-readable instructions that configures the design tool or computer to emulate the physical interface that will be embodied in the eventual IC system. An embodiment of a hierarchal interface description is implemented as a program product for use with a computer system. A program(s) of the program product defines functions of embodiments and can be contained on a variety of computer readable devices, such as: (i) information permanently stored on non-writable storage media (e.g., read-only memory devices within a computer such as CD-ROM or DVD-ROM disks readable by a CD-ROM drive or a DVD 30 drive); and (ii) alterable information stored on writable storage media (e.g., floppy disks within a diskette drive or hard disk drive or read/writable CD or read/writable DVD). Such computer readable devices, when carrying computer-readable instructions that direct functions of the invention, represent embodiments of the invention.

The IC system may be embodied on a single chip, such as configuring an FPGA with a bitstream to operate at the IC system, or is alternatively embodied in several chips or other components. In a particular embodiment, a physical interface between two components in an IC system is embodied in an FPGA (see FIG. 7). In a further embodiment, at least one of the components of the IC system is off-chip.

A particular hierarchical interface model 551 has three components or layers: behavioral 552, coding & timing 554, and signal 556. A first block 566 interfaces with the behavioral layer 552, which cooperates with the coding & timing layer 554 and the signal layer 556 to translate the block-specific interface to a common signal domain model 557 that communicates with a second hierarchical interface model 558. The second hierarchical interface model 558 takes the common signal domain model through its signal layer 564, coding & timing layer 562, and behavioral layer 560 to translate the common signal domain model to an interface compatible with the second block 568. Basically, even though the two blocks 566, 568 have different interface attributes, the first and second hierarchical interface models 551, 558, translate them to a commonly understood generalized model. Many blocks support reception and transmission of data or commands, so the arrows connecting the blocks through the layers of the hierarchical interface models as shown as double-ended. In some cases, a block only transmits to or only receives from a second block. An interface is sufficiently defined in the hierarchical interface model to automatically interface and connect system components, even when components have different time domains or data structures. The hierarchical interface model is also used in modeling and simulating the IC system, facilitating design and reducing time-to-market.

II-A. Behavioral Layer

The hierarchical interface description 550 includes a behavioral layer 552 that contains high-level attributes describing interface behaviors specific to a particular interface type (e.g., particular to a specific user block, see FIG. 1). By type, we mean that interfaces are classified into specific domains, which avoids having to capture all possible signaling standards and timings. This simplifies the system designer's task because it provides the designer with sets of closely related interfaces (blocks). Examples of interface types include packet, memory access, compute-specific, and event notification types. An interface type serves as an entry point for users to describe their interfaces and contains important configurable signal level attributes such as data bus width and address bus width. Behavioral attributes are organized in a hierarchical fashion as well, with more general behaviors controlling the definition and availability of less general (i.e., lower level) ones. For example, for memory access interfaces, the assertion of bursting enables additional attributes such as burst length, burst type and burst termination. Attributes are defined in general way, for example attribute names are a string of characters with no inherent meaning apart from the association of that attribute to lower layer definitions. Attribute values can be of several different types, such as string, integer, or Boolean. Various flags can be associated with attributes for use during interface comparison and resolution. An example of a flag is a "required" flag, which indicates if certain attributes must be defined before the process for creating an auto-bridge can be completed by the tool. Another example of a flag is an "initiator/target only" flag, which determines if an attribute can be defined only for the initiator or target interface and still be part of a valid connection. In the case an interface, there is generally one block that initiates communication and another block that receives or responds to it. It may be the case that both blocks can initiate and respond, and in some embodiments that situation is handled by splitting the connection up into two or more interfaces.

An example of a behavior layer is given below in Example A: Interface Description Language for Access Interface Type, where the "required" flag is indicated by a *, and the "initiator only" and "target only" flags are denoted by < and > respectively. An initiator only flag indicates that the associated attribute can be enabled for the initiator only and still be considered part of a valid connection. The hierarchy of attributes is shown in this example by the tab of each attribute row. For example, "Setup phase supported" is an attribute under "Indicate Valid Command", which is an attribute underneath "Behavior". Attributes in bold are considered primary attributes that would be displayed in a behavior definition dialog graphical user interface ("GUI") for users to customize and define. Additional attributes would be revealed based on primary attribute selection or enabling "advanced" mode in the dialog GUI. Square brackets are used to denote comments, and parentheses are used to denote attribute values. Choices between strings are shown by a vertical bar, while others are integer values. If no value is shown, it means the attribute is Boolean. Appendix A follows after the end of the description, but before the claims.

Behavioral attributes can be described in a text file that captures not only the behaviors of block interfaces but also the behaviors of the entire block as well. These include such attributes as block name, configuration attributes and block type. We can label the text file that contains these descriptions the Element Description Language ("EDL") file. A snippet example of an EDL is:

```
Element plb2opb_bridge {
    Type Bridge;
    IOPair = (SPLB, MOPB);
    /* PLB (slave) port */
    Input SPLB Access :: $ default :: Attributes(
        Behavior (
            supported_operations: (read, write)
            indicate_valid_command: "rnw & valid" (
                buslock_supported: true,
                abort_supported: true,
                address_supported: true,
                protected_access_supported: true
            ...
        Format (
            Data (
                Width (16, 32, 64, 128),
            ...
        Performance (
            Speed (100 MHz)
            ...
        )
    );
```

The EDL file above describes an element that is considered a bridge element (i.e., a block that can resolve the differences between two interfaces). The element also includes an I/O pair designation to indicate which interface ports can be used when using this element as a bridge.

Finally, behavior attributes are listed and defined to indicate the custom attributes of a specific interface for a given element. In order to support flexibility in attribution, a separate configuration file is used to capture and define the syntax and semantics of the EDL file. The data structure in this file is very similar to the interface description in an EDL but rather than specify a single value for a particular behavioral attribute, all possible behavioral attributes and the ranges that these attributes can have are specified. Attribute values are then expanded to include string choices and integer ranges. System design tools can then utilize this information during interface resolution to ensure a properly defined EDL. In addition, interface templates, which label a set of defined attributes as belonging to interface type A, can be added to accelerate interface comparison. The configuration information can be stored in a text file called the Interface Description Language ("IDL") file, an example of which can be seen in Appendix A. Through the use of EDL block descriptions, a system level tool can perform a number of useful tasks including verifying that the interface is properly defined; indicating if two interfaces match and if not, what specific area they do not match in; giving different levels of warnings, errors and suggestions when resolving interface differences to guide the designer; and defining the necessary attribution of the other end of a connection according to the definition of a single interface.

II-B. Coding and Timing Layer

The coding and timing layer 554 is not typically visible to the system level designer but can be useful to the interface or core designer. The purpose of the coding and timing layer is to specify signal timing and coding by describing the dependency between phases of an interface and mapping events to specific signal codes. The coding and timing layer allows for the expansion and redefinition of defined signals, codes, and timing in a pseudo-generic way. This layer is made up of three key components: events, groups, and phases. An event is a decoded meaningful signal assertion that is specific to each interface type. Memory access types would have such events as single read, burst write, and error response, while packet interface types would include such events as start-of-packet and end-of-packet.

A group is a bundle of one or more related signals, which includes not only standard buses such as a data bus and command bus, but also arrangements such as a read-valid signal bundled with a write-valid signal. A phase is an occurrence of a specific and defined pattern of values of signal groups, where the values of signal groups do not change for the duration over which the phase is valid. In addition, groups in a given phase operate in the same direction. An example of a phase would be the command phase in a memory access type containing the signal groups command bus (such as read- and write-valid) and command qualifiers (such as burst length). A data phase would include the data bus and data bus qualifiers. Dependencies are captured by mapping signal group values (codes) to specific events. For example, a "single read" timing event would map to b10 for the command signal group given the command signal group consists of {read_valid, write_valid}, as shown in the coding definition file ("CDEF"), below.

In some embodiments, events, groups and phases are defined in two text files, the phase definition file ("PDEF") and the CDEF. The PDEF predefines phases and events for a given interface type along with the timing between phases. The CDEF illustrates signal group codings for specific events. The phase and timing definitions of the PDEF and the specific phase-related sets of valid signals in the CDEF are all chosen based on attributes from the EDL.

The following is an example of a PDEF template:
```
<Interface Name>{
<Phase Name 1>{
    enable: <EDL attribute>=<val>;
    direction: input|output;
    assert: [<int>] [before|at|after]<phase name>
    [assert|release];
    release: fixed (<int>)|[<int>]
    [before|at|after]<phase name>[assert|release];
    events: <event name 1>, <event name 2>, ...
    <event name n>};
},
<Phase Name 2>{ ... },
...
<Phase Name N>{ ... }
};
```
The following is an example of a PDEF definition:
```
//Generated PDEF based on EDL (OPB)
Access {
Request {
    direction: output;
    assert: after Request release;
``` release: at TransferResponse release;
events: "read", "write", "read burst", "write burst";},
TransferResponse {
direction: input;
assert: after Request assert;
release: fixed(1);
events: "ok", "error", "timeout";},
};
The following is an example of a CDEF:
Signal wrvld
(
Type: "Access";
Phase: "Request";
SubGroup: "command";
SubGroupCode: "3";
Event: "read", Value=b0;
Event: "write", Value=b1;
Event: "read burst", Value=b1;
Event: "write burst", Value=b1;
Enable: Behavior.IndicateValidCommand="read valid and write valid";
Width: 1;
Direction: Output;
);
Signal addr
(
Type: "Access";
Phase: "Request";
SubGroup: "address";
Enable: Behavior.IndicateValidCommand.AddressSupported="1";
Width: Format.Address.width;
Direction: Output;
);

II.-C Signal Layer

The signal layer 556 describes low-level signal attributes such as port name, net name, signal direction and width. The signal layer may also encompass a number of extended signal parameters such as inversion, padding, justification, byte alignment, edge response, and type. Most prior works that utilize interface properties focus solely on this level of detail, which limits the amount of intelligence a tool can have since nothing is said about what the order and meaning of the signals are. However, the signal layer is necessary for basic signal mapping and simple type checking. One example of a signal layer file is an microprocessor peripheral definition ("MPD") file:

Bus Interfaces

BUS_INTERFACE BUS=SOPB, BUS_STD=OPB, BUS_TYPE=SLAVE

Generics for VHDL or Parameters for Verilog

PARAMETER C_BASEADDR=0xFFFFFFFF, DT=std_logic_vector, MIN_SIZE=0x100

PARAMETER C_OPB_DWIDTH=32, DT=integer, ASSIGNMENT=CONSTANT

PARAMETER C_OPB_AWIDTH=32, DT=integer, ASSIGNMENT=CONSTANT

Ports

PORT OPB_Clk="", DIR=I, SIGIS=CLK, BUS=SOPB

PORT OPB_Rst=OPB_Rst, DIR=I, BUS=SOPB

PORT Interrupt="", DIR=O, EDGE=RISING, SIGIS=INTERRUPT, INTERRUPT_PRIORITY=LOW

PORT OPB_ABus=OPB_ABus, DIR=I, VEC=[0:C_OPB_AWIDTH-1], BUS=SOPB

PORT OPB_BE=OPB_BE, DIR=I, VEC=[0:C_OPB_DWIDTH/8-1], BUS=SOPB

PORT OPB_RNW=OPB_RNW, DIR=I, BUS=SOPB

PORT OPB_select=OPB_select, DIR=I, BUS=SOPB

PORT OPB_seqAddr=OPB_seqAddr, DIR=I, BUS=SOPB

PORT OPB_DBus=OPB_DBus, DIR=I, VEC=[0:C_OPB_DWIDTH-1], BUS=SOPB

PORT UART_DBus=SI_DBus, DIR=O, VEC=[0:C_OPB_DWIDTH-1], BUS=SOPB

An MPD file is a file which is used in the XILINX EMBEDDED DEVELOPMENT KIT, a software tool, available from XILINX, INC., of San Jose, Calif. An MPD file is generally not modified directly by the user, but can be automatically generated or defined in some cases, and read-in by the tool for further processing.

Another example of a signal layer file is an IP-XACT definition file, which is a file standard created by THE SPIRIT CONSORTIUM of Napa, Calif.:

```
<spirit:component
xmlns:spirit="http://www.spiritconsortium.org/XMLSchema/SPIRIT/1.4"
xmlns:xsi="http://www.w3.org/2001/XMLSchema-instance"
xsi:schemaLocation="http://www.spiritconsortium.org/XMLSchema/
SPIRIT/1.4 http://www.spiritconsortium.org/XMLSchema/SPIRIT/1.4/
index.xsd">
    <spirit:vendor>spiritconsortium.org</spirit:vendor>
    <spirit:library>Leon2</spirit:library>
    <spirit:name>uart</spirit:name>
    <spirit:version>1.4</spirit:version>
    <spirit:busInterfaces>
        <spirit:busInterface>
            <spirit:name>APBClk</spirit:name>
<spirit:busType spirit:vendor="amba.com" spirit:library="AMBA2"
spirit:name="APB" spirit:version="r0p0"/>
            <spirit:system>
                <spirit:group>APB_CLK</spirit:group>
            </spirit:system>
            <spirit:connection>required</spirit:connection>
            <spirit:portMap>
                <spirit:portName>
                    <spirit:componentPortName>clk</spirit:componentPortName>
                    <spirit:busPortName>PCLK</spirit:busPortName>
                </spirit:portName>
            </spirit:portMap>
        </spirit:busInterface>
```

Through the use of this hierarchical model, embodiments expose different levels of interface behavior to designers without requiring full automata descriptions. The system level architect can customize the behavior layer and rely on automated tools to resolve any remaining differences on the lower layers. Embodiments also allow component designers to customize interfaces down to the coding and timing layer and the signal layer in order to completely specify a unique interface within the framework of the supported interface types. Automated interface resolution tools can then take these descriptions and resolve the interface connection automatically, with results ranging from indicating that a connection is not possible, and indicating which aspects of the interfaces are incompatible, to automatically synthesizing a bridge component to connect two disparate blocks together. The architecture of the resulting bridge element can be extended to include entire bus and switch topologies, rather than being just a simple shim. Performance and size tradeoffs can be guided by the user and automated by the design tool, leading to accelerated system level prototyping and design.

Figure 6:
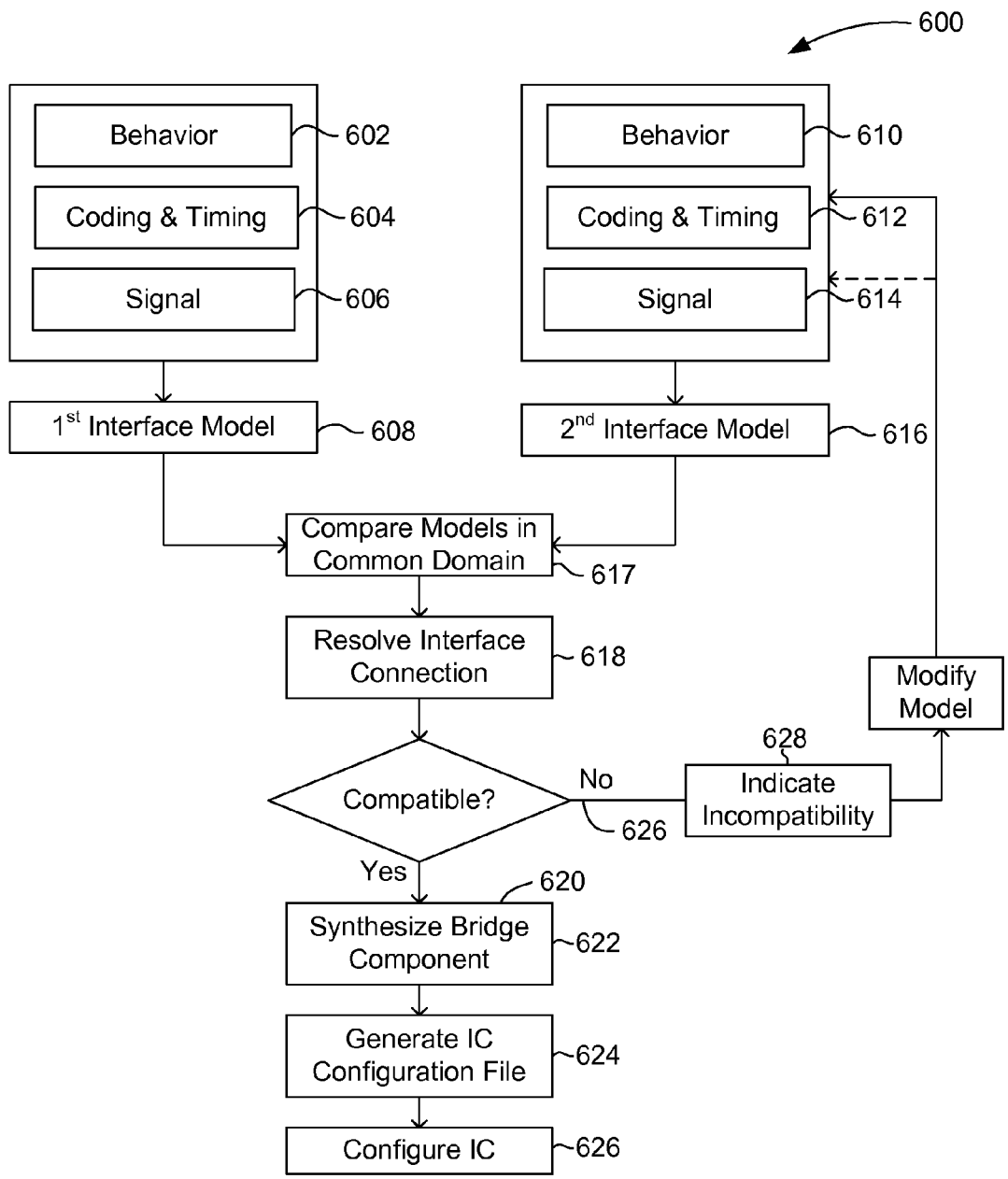
FIG. 6 is a flow chart of a method of designing an interface according to an embodiment of the invention.

FIG. 6 is a flow chart of a computer-implemented method of designing an interface in an IC system 600 according to an embodiment of the invention. A first block has a first block interface type having first block interface attributes (e.g., signals (data width) and timing (clock domain)). In a particular embodiment, the block is a user block or application, or a functional block of an IC, such as an FPGA, supplied by the IC vendor, or third party intellectual property ("IP") cores that are to be incorporated into the IC. A first phases block translates the first block interface type into a first behavioral interface type (see, e.g., FIG. 5B, ref. num. 557) by describing the first interface type in a behavioral layer of a hierarchical interface model (step 602) to produce a first behavioral interface definition. In a particular embodiment, the first behavioral interface definition is produced as an EDL file.

The first interface definition is re-defined in a coding and timing layer of the hierarchical interface model (step 604) to produce a phase definition file and a coding definition file. In some embodiments, the phase definition file or the coding definition file is pre-defined such that a designer need not define them. In a particular embodiment, the phase definition file predefines phases and events for a given interface type along with the timing between phases based on attributes from the EDL file. The coding definition file illustrates signal group codings for specific events, also based on attributes from the EDL file.

A signal layer of the hierarchical interface model maps and characterizes the first interface definition (step 606) (e.g., bursting, flow-control, input, output), which will be checked to the corresponding interface definition (see, e.g., step 618) when the interface connection is resolved to insure compatibility. The behavioral, coding and timing, and signal layers combine to produce a hierarchical interface model (step 608) that is embodied as a set of computer-readable instructions in one or more computer readable devices (see, e.g., FIGS. 5A, 5B).

In a further embodiment, a second interface definition of a second block is defined using second behavioral (step 610), coding and timing (step 612) and signal (step 614) layer models to produce a second hierarchal interface model (step 616). An automated interface resolution tool operating on a computer compares the first hierarchical interface model with the second hierarchical interface model in a common signal domain (step 617) and resolves an interface connection between the first and second blocks (step 618). In a particular embodiment, the automated interface resolution tool synthesizes a bridge component (see, e.g., FIG. 4, ref. num. 406) between the two blocks that is embodied as a set of configuration instructions for a configurable logic device (e.g., a portion of a configuration file of an FPGA). In a yet further embodiment, the bridge component is included in a configuration file (step 620) of a configurable logic device, and the configurable logic device is configured into an IC having the bridge component. In a particular embodiment, the first and second blocks are also configured in the IC, and may be parts of the configuration file including the bridge component. In alternative embodiments, the first or second block is external to the IC or hard-wired ("burned") into the IC.

In an alternative embodiment, the automated interface resolution tool indicates that a connection between the blocks is not possible (branch 620). In a further embodiment, the automated interface resolution tool indicates which aspects of the interfaces are incompatible (step 622), and a component designer modifies the signal or coding and timing layers of one or both interface models to resolve the compatibility, and re-runs the model. If two interfaces are incompatible it may be due to one of two reasons: (1) the models are wrong in which case the statement is correct, or more likely (2) the interfaces can't be resolved which means the two blocks shouldn't be connected or the designer has to modify not only the model but the actual block that the model models to reflect a change in behavior in order to resolve the differences. This basically falls into the realm of incompatible interfaces.

Figure 7:
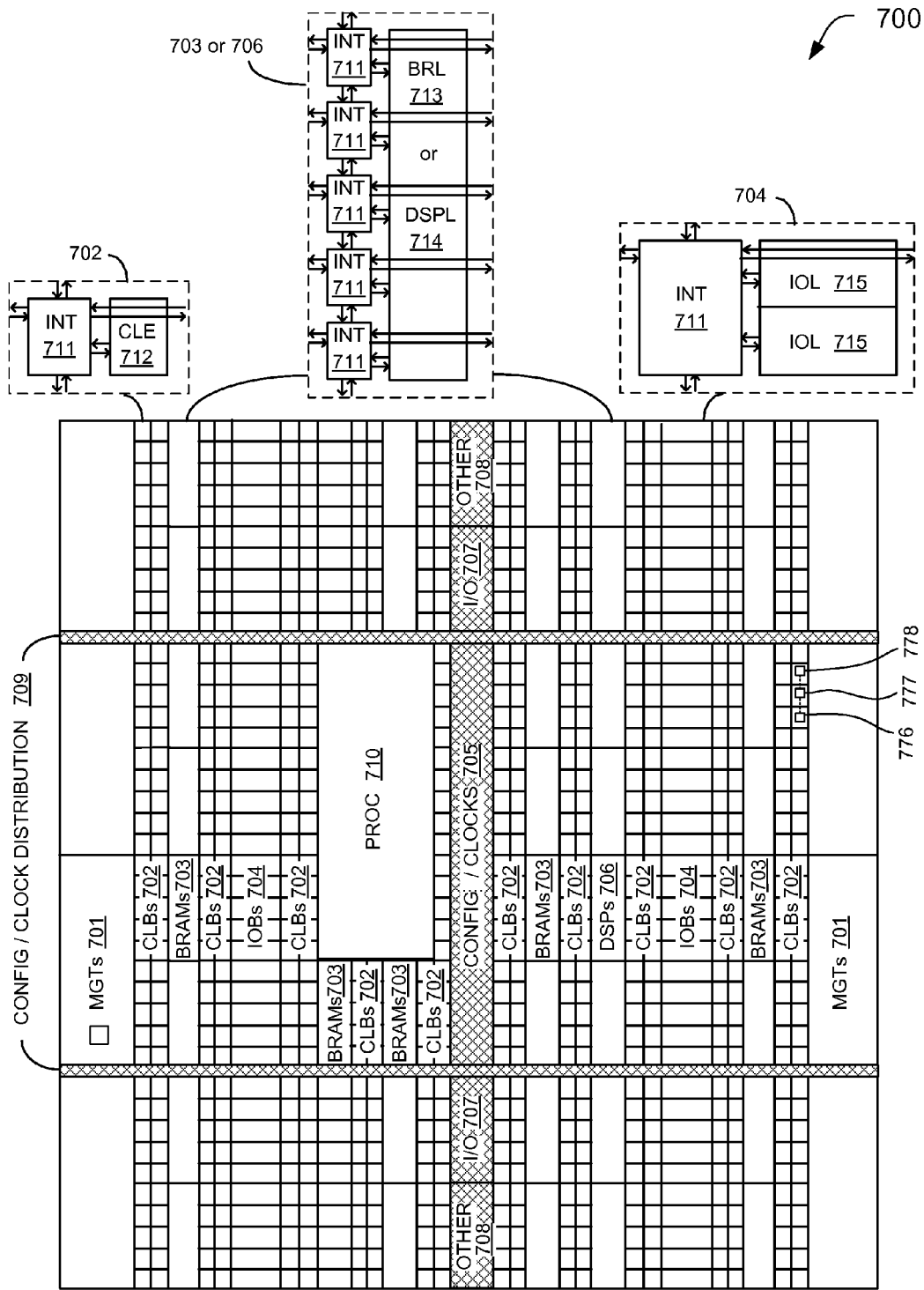
FIG. 7 is a plan view of an FPGA according to an embodiment.

FIG. 7 is a plan view of an FPGA 700 according to an embodiment. The FPGA 700 includes CMOS portions in several of the functional blocks, such as in RAM and logic, and is fabricated using a CMOS fabrication process. The FPGA is configured to have at least one bridge component (intermediate component or intermediate block) 777 translating or converting the interface protocol of a first block 776 and the interface protocol of a second block 778 to a common signal domain standard, which connects the first and second blocks in the FPGA system (as represented by the dotted line). In an alternative embodiment, at least one of the first or second blocks 776, 778 is off-chip. While it may be possible to resolve two single CLB/interconnect blocks using another single CLB/interconnect, it's more likely that the user blocks and the auto-bridge use several CLBs. A typical CLB has many embedded interconnects, and hence and auto-bridge according to an embodiment may have many embedded interconnects. One of ordinary skill in the art of FPGAs will recognize the blocks and interconnects shown in FIG. 7 are simplified for purposes of illustration.

The FPGA architecture includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715. In the pictured embodiment, a columnar area near the center of the die (shown shaded in FIG. 7) is used for configuration, clock, and other control logic.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, although specific embodiments are described in terms of specific ICs, design tools and software, other tools and modeling environments are alternatively used. Therefore, the spirit and scope of the appended claims should not be limited to the foregoing description.

APPENDIX A

Interface Description Language (IDL) Example for Access Interface Type

Behavior [dynamic organization of information, timing, protocol; affects presence or absence of specific physical signals]
   *Supported Operations (Read, Write)
   Data Bus Sharing (Separate|Shared)
   Command/Address Sharing (Separate|Shared)
   Arbitration
   *Indicate Valid Command (mw & valid|wnr & valid|read valid & write valid|enable & write enable|code & valid|code)
     Setup phase supported
     Buslock supported
     Abort Supported
     Address Supported
       Different Data Widths Supported (native|dynamic sizing)
     Protected Access Supported
   Indicate Valid Block Transfer (valid|valid+size|size|type)
     First Transfer Request Supported
     Last Transfer Request Supported
     Address Types (constant, incrementing, wrap,xor)
   *Indicate Accepted Command (auto|command ack|data ack|ready|data ready)
     Timeout Supported
       <Wait Supported
     Retry Supported
   Indicate Valid Data Transfer (wr_valid)
     Indicate Valid Data Lanes (byte enable|write byte enable|size)
     Used for block transfer length during block transfers [specific to PLB]
   Indicate Accepted Data Transfer (auto|ready|waitrequest|data ack|data ack+cmd deassert|response code|FIFO status)
     Error Supported (with data ack|w/o data ack)
     Last Block Transfer Response Supported
       Block Transfer Termination Supported
     Address Response Supported [for cacheline reads]

Format [static organization of information; affects how size, sensitivity, direction of physical signals]
   >Block Transfer
     Supported Lengths (2, 3, 4, . . . , 16, 4-line cache, 8-line cache, etc., variable
     Supported Widths (byte, half-word, word, double-word)
     Transfer Info [miscellaneous undefined transfer qualifiers, e.g. ordered, attribs
     Width (int)
     Command Setup Time (int)
     Max Command Wait Time (int)
     Max Transfer Wait Time (int)
   *Data
   *Width (int) [byte aligned]
     Byte Order (Big Endian|Little Endian
     Bit Order (High to low|Low to high)
     Parity
     Tag
       Width (int)
     Control/Info
       Width (int)
   Address
     Width (int) [affects memory map]
     Resolution (byte|data width)
     Parity
     Tag
       Width (int)
     Control/Info
       Width (int)
   Transfer Response
     Tag
       Width (int)
     Code
       Width (int)
Performance
   Speed (MHz)
   Maximum burst size (in native data widths|in bytes)

What is claimed is:

1. An integrated circuit ("IC"), comprising:
an auto-bridging architecture including
a first phases block interfacing to a first user block having a first user signal domain, the first phases block configured to convert the first user signal domain to a common signal domain; and
a second phases block coupled to the first phases block and interfacing with a second user block having a second user signal domain, the second phases block configured to convert the second user signal domain to the common signal domain, the first user block cooperating with the second user block through the auto-bridging architecture of the IC.

2. The IC of claim 1, wherein the first phases block includes a first code translator translating a first signal from the first user block to an event in the common signal domain and generating an assert signal coupled to the second phases block.

3. The IC of claim 2, wherein the second phases block includes a second code translator translating the event to a second signal coupled to the second user block.

4. The IC of claim 2, wherein the first phases block further includes a first phase register and the second phases block further includes a second phase register, the first phase register passing data to the second phase register through the common signal domain.

5. The IC of claim 1, further comprising an intermediate component in the common signal domain disposed between the first phases block and the second phases block.

6. The IC of claim 5, wherein the intermediate component includes a phase replicator.

7. The IC of claim 6, wherein the intermediate component further includes an address register disposed between a first phase register in the first phases block and a second phase register in the second phases block.

8. The IC of claim 5, wherein the first user signal domain has a first data width and a first clock domain, and the second user signal domain has a second data width or a second clock domain.

9. The IC of claim 1, wherein the IC is a field-programmable gate array and the auto-bridging architecture is configured in the field-programmable gate array.

10. The IC of claim 9, wherein the first user block is also configured in the field-programmable gate array.

11. A method of designing the IC of claim 1 in accordance with the following steps:
  modeling a first interface of a first user block including translating first interface attributes to a first behavioral interface definition, further defining the first behavioral interface definition in a first coding and timing layer, and mapping the first coding and timing layer to a first signal layer to produce a first hierarchical interface model;
  modeling a second interface of a second user block in a second hierarchical interface model including translating second interface attributes to a second behavioral interface definition, further defining the second behavioral interface definition in a second coding and timing layer of the second interface in the second hierarchical interface model, and mapping the second coding and timing layer to a second signal layer of the second hierarchical interface model;
  comparing the first hierarchical interface model with the second hierarchical model in a common signal domain; and
  resolving an interface connection between the first user block and the second user block,
  wherein the comparing and resolving are performed by a computer.

* * * * *